(12) United States Patent
Bateman et al.

(10) Patent No.: US 8,450,051 B2
(45) Date of Patent: May 28, 2013

(54) USE OF PATTERNED UV SOURCE FOR PHOTOLITHOGRAPHY

(75) Inventors: Nicholas Bateman, Reading, MA (US); Peter Kurunczi, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 252 days.

(21) Appl. No.: 12/973,065

(22) Filed: Dec. 20, 2010

(65) Prior Publication Data
US 2012/0156592 A1  Jun. 21, 2012

(51) Int. Cl.
*G03F 7/20* (2006.01)
(52) U.S. Cl.
USPC .......................................... 430/322; 430/325
(58) Field of Classification Search
None
See application file for complete search history.

(56) References Cited

U.S. PATENT DOCUMENTS

| | | |
|---|---|---|
| 6,695,664 B2 | 2/2004 | Eden et al. |
| 6,703,771 B2 | 3/2004 | Becker et al. |
| 6,867,548 B2 | 3/2005 | Eden et al. |
| 7,056,416 B2 | 6/2006 | Okumura et al. |
| 2009/0079323 A1 * | 3/2009 | Gotou et al. ................. 313/485 |
| 2009/0190107 A1 * | 7/2009 | Holt ................................. 355/44 |
| 2009/0227095 A1 | 9/2009 | Bateman et al. |
| 2009/0229972 A1 | 9/2009 | Sankaran et al. |

FOREIGN PATENT DOCUMENTS
WO  2007002170 A2  1/2007

OTHER PUBLICATIONS

Becker, K.H., et al., Topical Review: Microplasmas and Applications, Journal of Physics D: Applied Physics, Feb. 7, 2006, pp. R55-R70, vol. 39, No. 3, IOP Publishing, Bristol, Great Britain.
Park, S-J, et al., Arrays of Addressable Microcavity Plasma Devices, IEEE Transactions on Plasma Science, Apr. 1, 2007, pp. 215-222, vol. 35, No. 2, IEEE Service Center, Piscataway, New Jersey, USA.

* cited by examiner

*Primary Examiner* — John A. McPherson

(57) ABSTRACT

A system and method of exposing photoresist on the surface of the solar cell to light so as to create an appropriate mask is disclosed. A microcavity array is used to expose the photoresist to UV light in a pattern that matches the desired pattern on the solar cell. Microcavity arrays consist of an array of cavities, which may include tens of thousands of cavities. When an appropriate potential is applied to an electrode, a plasma is formed in the activated cavity. If the cavity contains a suitable gaseous environment, these activated cavities will emit light in the near ultraviolet spectrum. By properly configuring the locations of the activated cavities, a UV source may be created that exposes the photoresist in a desired pattern. The desired pattern can be created by selectively activating cavities, disabling certain cavities, or filling certain cavities so that they cannot create a plasma.

15 Claims, 6 Drawing Sheets

USE OF PATTERNED UV SOURCE FOR PHOTOLITHOGRAPHY

FIELD

This invention relates to implantation of ions in silicon substrates and, more particularly, to a system and method for creating photoresist masks for solar cells.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Doping may improve efficiency of solar cells. FIG. 1 is a cross-sectional view of a selective emitter solar cell 210. It may increase efficiency (e.g. the percentage of power converted and collected when a solar cell is connected to an electrical circuit) of a solar cell 210 to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 μm across. FIG. 2 is a cross-sectional view of an interdigitated back contact (IBC) solar cell 220. In the IBC solar cell, the junction is on the back of the solar cell 220. The doping pattern is alternating p-type and n-type dopant regions in this particular embodiment. The p+ emitter 203 and the n+ back surface field 204 may be doped. This doping may enable the junction in the IBC solar cell to function or have increased efficiency.

As shown in FIG. 3, the doping pattern includes alternating p-type and n-type dopant regions in this particular embodiment. The p+ emitter 203 and the n+ back surface field 204 are appropriately doped. This doping may enable the junction in the IBC solar cell to function or have increased efficiency.

Some solar cells, such as IBC solar cells, require that different regions of the solar cell be p-type and others n-type. It may be difficult to align these various regions without overlap or error. For example, the p+ emitter 203 and n+ back surface field 204 in FIG. 3 must be doped. If overlap between the p-type regions 203 and the n-type regions 204 exists, counterdoping may occur. Any overlap or misalignment also may affect the function of the solar cell. For solar cells that require multiple implants, particularly those with small structure or implant region dimensions, the alignment requirements can limit the use of a shadow mask or proximity mask. In particular, as shown in FIG. 3, an IBC solar cell requires alternating lines doped with, for example, B and P. Therefore, any shadow mask or proximity mask for the B implant has narrow, long apertures that are carefully aligned to the small features that were implanted with P using a different proximity mask or shadow mask.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. Currently, the use of photoresist, however, would add an extra cost to solar cell production because extra process steps are involved. For example, a shadow or proximity mask must be created and used to illuminate a portion of the photoresist, such that a hardened mask is created on the surface of the solar cell.

Accordingly, there is a need in the art for an improved method of implanting a solar cell and, more particularly, a system and method of exposing the photoresist on the surface of the solar cell to light so as to create the appropriate mask.

SUMMARY

A system and method of exposing photoresist on the surface of the solar cell to light so as to create an appropriate mask is disclosed. A microcavity array is used to expose the photoresist to UV light in a pattern that matches the desired pattern on the solar cell. Microcavity arrays consist of an array of cavities, which may include tens of thousands of cavities. When an appropriate potential is applied to an electrode, a plasma is formed in the activated cavity. If the cavity contains a suitable gaseous environment, these activated cavities will emit light in the near ultraviolet spectrum. By properly configuring the locations of the activated cavities, a UV source may be created that exposes the photoresist in a desired pattern. The desired pattern can be created by selectively activating cavities, disabling certain cavities, or filling certain cavities so that they cannot create a plasma.

BRIEF DESCRIPTION OF THE DRAWINGS

For a better understanding of the present disclosure, reference is made to the accompanying drawings, which are incorporated herein by reference and in which:

FIG. 3 is a cross-sectional view of implantation through a mask;

DETAILED DESCRIPTION

Embodiments of this system are described herein in connection with solar cells. However, the embodiments of this system can be used with, for example, semiconductor substrates or flat panels. Thus, the invention is not limited to the specific embodiments described below.

Figure 4:
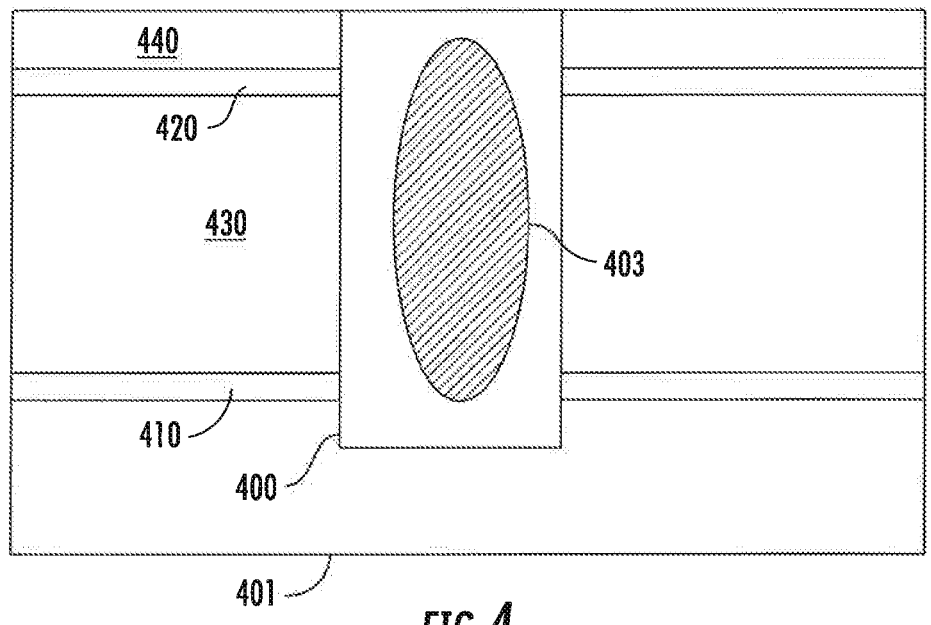
FIG. 4 a cross-sectional view of one embodiment of a microcavity.

FIG. 4 is a cross-sectional view of one embodiment of a microcavity. In this embodiment, cavities 400 are created in a substrate 401. A first electrode 410 and a second electrode 420, having different potentials are formed around the cavity. These electrodes 410, 420 are separated, such as by dielectric layer 430. A protective layer 440, such as a second dielectric layer, is located above the second electrode 420. In operation, a gas is injected into the cavity 400. When the electrodes 410, 420 are activated, a potential difference appears across the height of the cavity 400. This potential difference causes the injected gas to become plasma 403. If a suitable gas is selected, this plasma will emit light in the ultraviolet spectrum. Such gasses include, for example, argon, xenon, xenon-neon, argon-deuterium and nitrogen.

Figure 5:
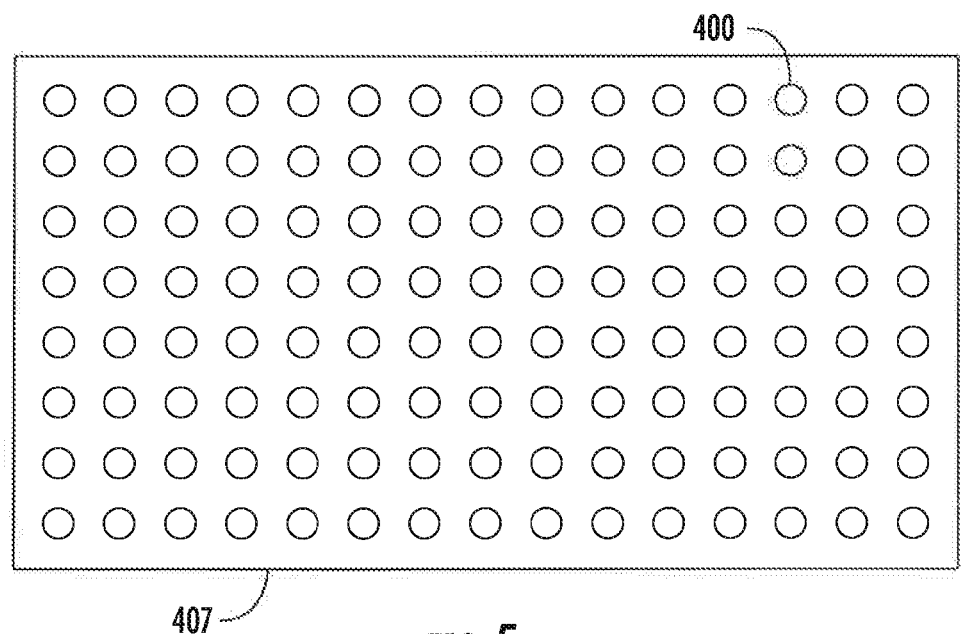
FIG. 5 shows a top view of a microcavity array.

FIG. 5 shows a top view of a microcavity array 407. In this embodiment, the cavities 400 are arranged in rows and columns to form an array. In some embodiments, the microcavities 400 are formed through the use of photolithography. For example, photoresist is not deposited in those areas that will form the cavities 400. An etching process is then performed which removes material in the exposed regions of the substrate, thereby creating the cavities 400. Linear cavities have been built as small as 5 um in width, and point cavities with spacings of 100 um have been made. Therefore, a resolution of 100 um is readily achievable with current technology.

Figure 6:
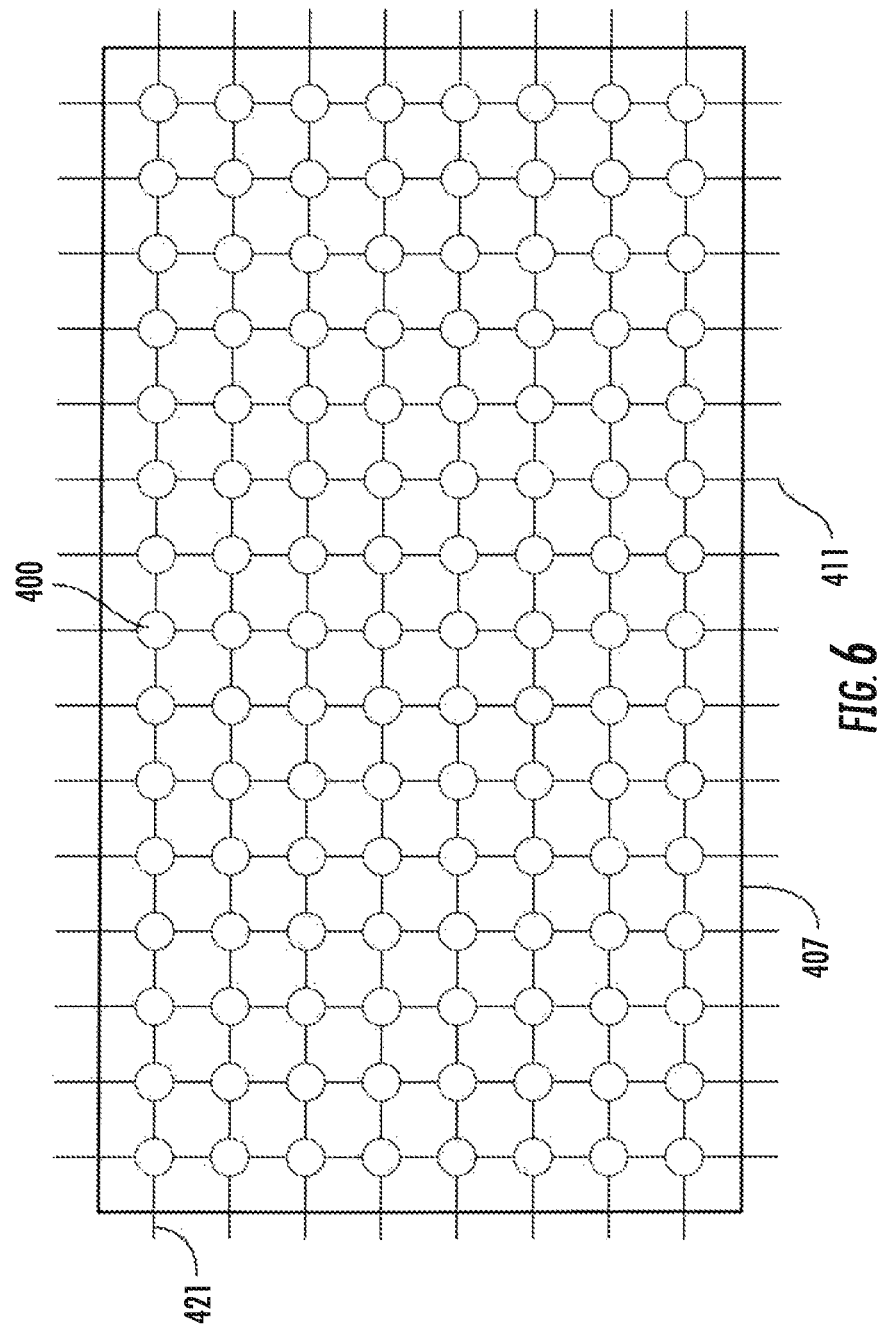
FIG. 6 shows a top view of an addressable microcavity array.

The first electrode 410 and second electrode 420 may be configured in a number of ways. In one embodiment, the first electrodes 410 for all cavities are connected together. Similarly, the second electrodes 420 for all cavities 400 are connected together. In this embodiment, either all of the microcavities 400 are activated or none of the microcavities 400 are activated. In another embodiment, shown in FIG. 6, all first electrodes 410 in each column 411 are connected together. Similarly, all second electrodes 420 in each row 421 are connected together. In this way, the selection of a particular row 421 and column 411 activates exactly one microcavity. Of course, other configurations can be created whereby groups of microcavities may be addressable. For example, multiple rows 421 or columns 411 may be electrically connected such that clusters of cavities are activated simultaneously.

The use of microcavity arrays allows new methods of exposing photoresist to ultraviolet light, for purposes of creating a mask on the substrate.

In one embodiment, a microcavity array having individually addressable microcavities (or addressable groups of microcavities) is used. A photoresist is applied to the surface of the substrate. The microcavity array is then brought in close proximity to the surface of the substrate. In some embodiments, this distance is approximately 1 mm.

In some embodiments, the environment in which the microcavity array is placed is filled with a suitable gas, such as nitrogen. In other embodiments, shown in FIG. 7, a surface 460, such as a glass surface, is placed over the microcavity array 407, so as to form a tight seal. The individual cavities 400 are filled with the desired gas, which is contained in the volume defined by the cavities 400 and by the surface 460. Such a configuration may be advantageous if the gas used is rare or expensive. In this embodiment, the microcavity array may be constructed such that the surface 460 is sealed to the array 407 and gas is injected prior to the sealing of the surface 460.

The desired microcavities 400 are then activated, which causes a plasma 403 to form in these desired cavities. This plasma emits ultraviolet light, which exposes the photoresist 480 located directly beneath the plasma. If a positive photoresist is used, the photoresist located beneath the activated cavities 471 becomes hardened. If a negative photoresist is used, the photoresist located beneath the unactivated cavities 472 becomes hardened.

Figure 1:
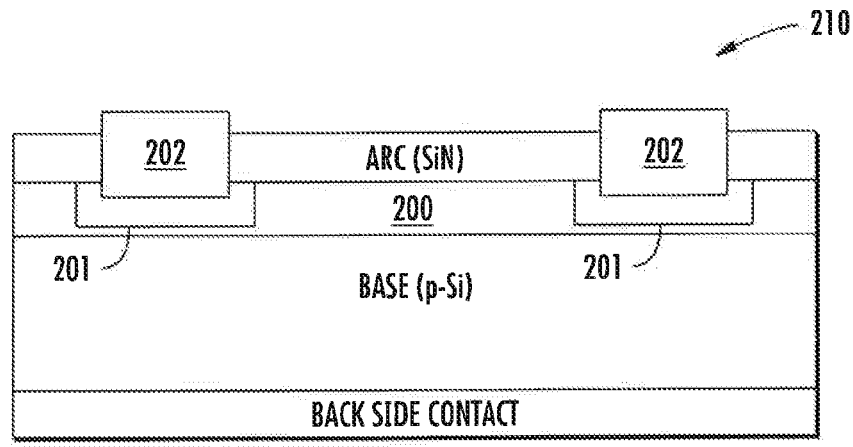
FIG. 1 is a cross-sectional view of a selective emitter solar cell.
Figure 2:
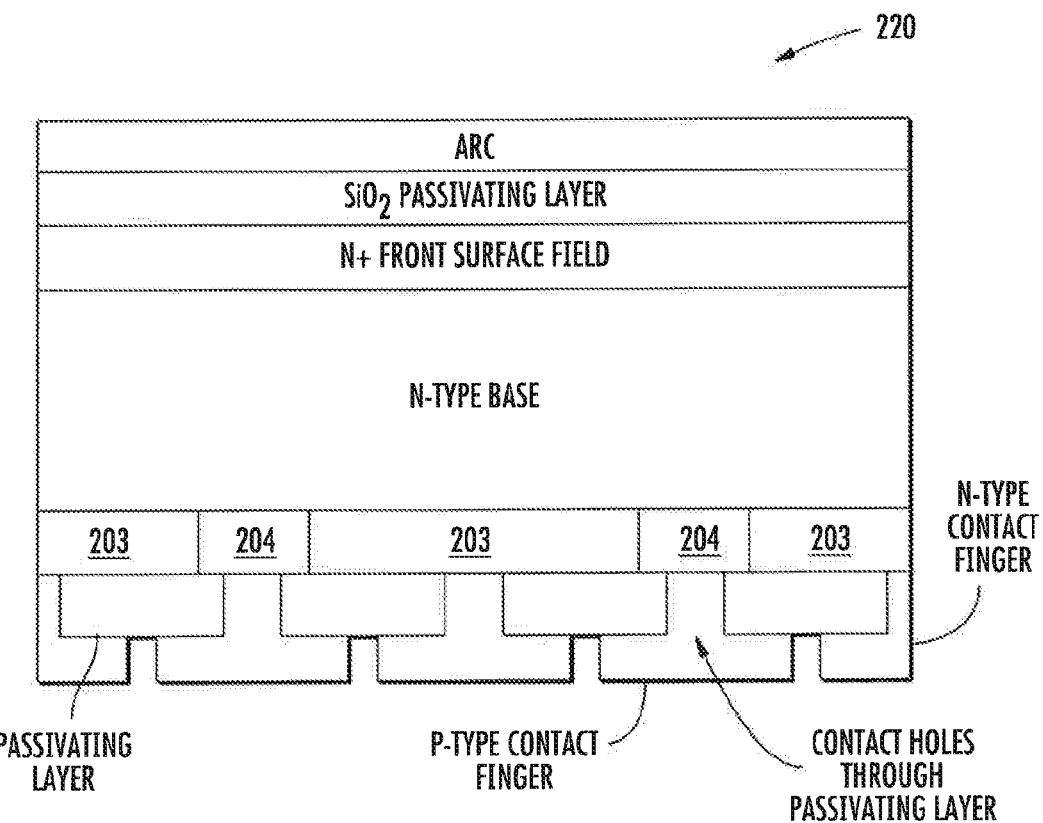
FIG. 2 is a cross-sectional view of an interdigitated back contact solar cell.
Figure 3:
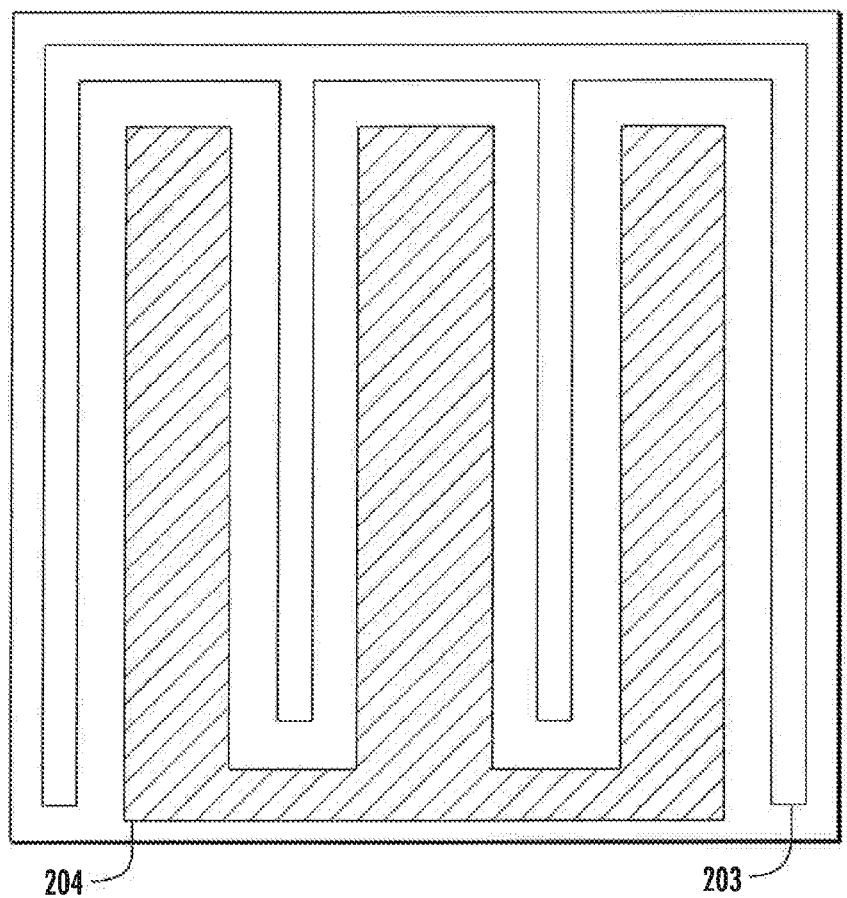
FIG. 3 is a view of an interdigitated back contact solar cell.

In another embodiment, the pattern of light is predetermined. In this embodiment, the microcavity array is created having cavities only in those regions where light is desirable. Microcavity arrays are produced using semiconductor processes, such as photolithography. In one case, a grid of thin photoresist lines is deposited on a silicon wafer, and an anisotropic etch is applied. The etch then creates inverted pyramids between each line in the photoresist. These pyramids become the microcavities. By proper application of photoresist, arrays having microcavities only in particular locations can be fabricated. The inactive parts of the array may be covered with photoresist, such that no inverted pyramids are created in the appropriate regions. This creates a specific pattern of cavities and can be particularly effective for patterns that are commonly used. For example, FIG. 3 shows the patterns used for IBC solar cells. One or more specially designed microcavity arrays can be designed to create the masks needed to implant regions 203, 204.

In another embodiment, the microcavity array is manufactured so as to create a complete array, as shown in FIG. 5. Certain cavities are then disabled, such as by filling them with a suitable material to prevent a plasma from forming in specific cavities. In one embodiment, inkjet or screen print technologies are used to dispense a material, such as an organic material, to effectively "clog" the inactive cavities. Alternately, photolithography could be used to set the resist in the appropriate regions of the array. This may be more flexible than the first inkjet approach because the coating could be removed and re-printed to change the pattern. The resulting pattern, much like that described in the previous embodiment, is useful for commonly needed patterns, such as the back surface of an IBC solar cell.

In another embodiment, the electrical connections to the cavities that need to be deactivated can be broken mechanically to render a set of cavities inactive. This technique may work best when the active cavities are contiguous, but by choosing positive or negative photoresist, there is some flexibility in this choice. In one embodiment, a laser can be used to ablate the dielectric layer 430 and the electrode 420 on select parts of the array. This would be between cavities 400 where the laser can be easily focused and the electrode 420 readily accessed. Etching through a mask may accomplish the same result. In this case, a mask would be, for instance, inkjet printed over the array and the dielectric and electrode removed.

In summary, several methods are disclosed to modify the operation of a traditional microcavity array for the purpose of creating ultraviolet light for exposure to photoresist. First, the power to one or more cavities can be controlled. This can be done using addressable cavities, or by separating one or more electrodes from the power source. Secondly, gas can be prevented from entering one or more cavities, such as by applying a material to fill certain cavities. Thirdly, the cavities can be eliminated, such as by manufacturing the microcavity array without one or more of the cavities.

Figure 7:
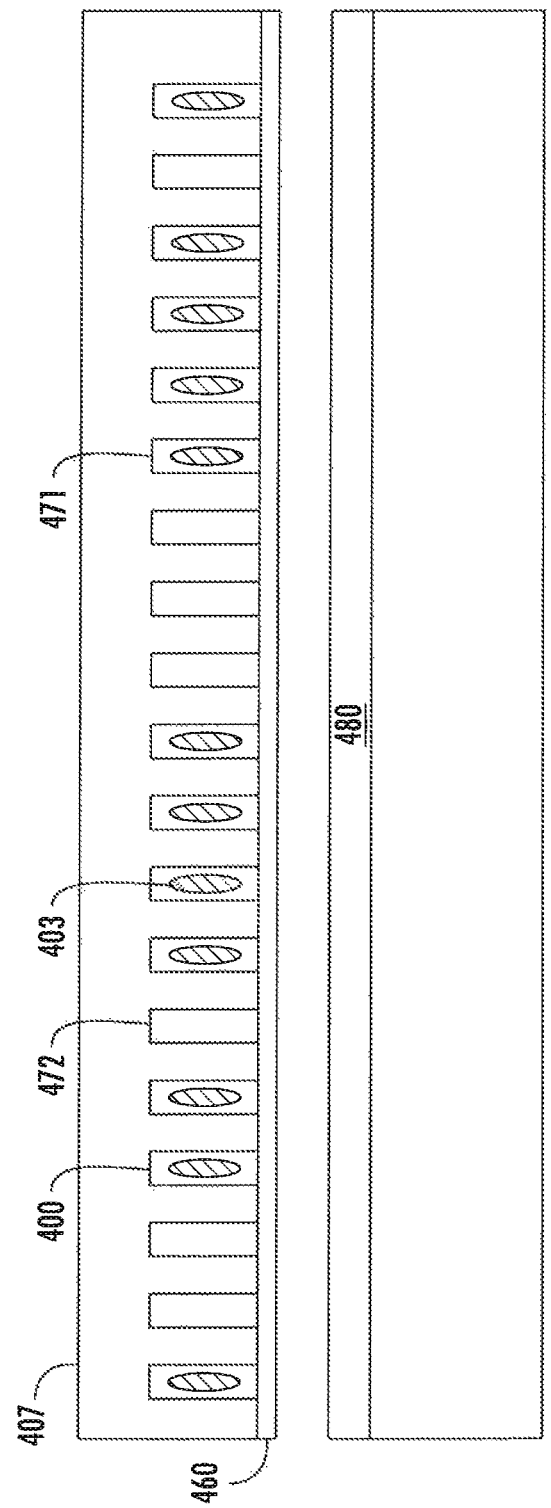
FIG. 7 illustrates the use of a microcavity to expose photoresist to ultraviolet light.
Figure 8:
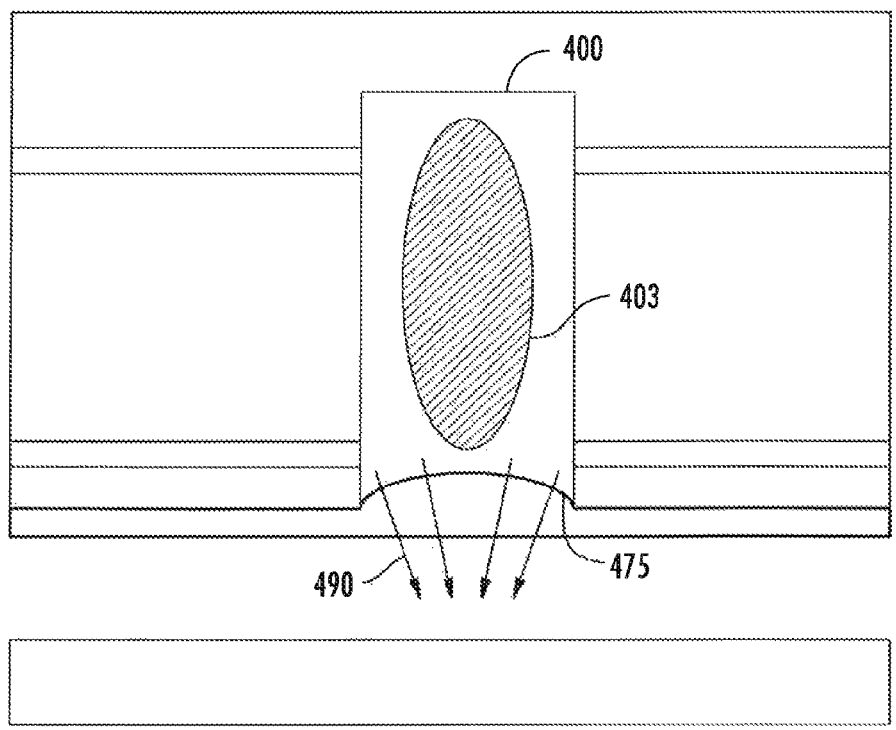
FIG. 8 illustrates the use of a glass surface as a lens to focus the ultraviolet light.

In order to achieve smaller features than the cavity size, the glass surface of FIG. 7 can be used as a lens. FIG. 8 shows an embodiment, where the glass surface is used as a lens. The diverging light 490 emitted by the cavity 400 becomes focused as it passes through the lens 475. Such a technique is possible, as the scale (size) of the microcavity array is roughly the same as the size of a CMOS sensor. This lens structure allows better collection of the emitted light to improve the fidelity of the transfer of the pattern of microcavities to the substrate.

While this form of lithography may find many applications for structures in the scale of tens of microns, a primary application would be for the manufacture of silicon solar cells. In solar cell manufacture, this lithography method can be used for various processes and solar cell architectures.

In the case of implanting ions into the substrate, the photoresist can be used as a soft mask for ion implantation to allow patterned doping of the substrate.

In the case of etching, the photoresist can be used as an etch resist to allow etching. Patterned etching can be used to make holes in passivating dielectrics (for example the front side anti-reflective coating on a standard solar cell design) or to etch back the silicon substrate (for example to remove the heavily doped surface between the metal lines on the emitter of a standard solar cell design).

In the case of metallization, the photoresist can be used to liftoff a metallization that covers the entire face of the solar cell, such as evaporation or sputtering.

In one application, when doping an interdigitated back cell, the same pattern on the microcavity array can be used with negative and positive photoresists to create complementary regions of p-type and n-type dopants. The fact that the same array of UV sources is used to create each pattern removes most of the problems of relative alignment.

Relative to conventional proximity masking the microplasma exposure offers several advantages. First, the UV source is very close to the wafer, and the UV light is created with some level of parallelism. By contrast, when using a proximity mask the UV source must either be very far from the substrate to ensure that the light is parallel, or expensive optics must be used to make the light parallel. Secondly, because almost all the emitted UV light will be absorbed in the photoresist the power required for the microcavity array is much smaller than that required for a proximity mask where most of the UV light will be absorbed in the mask, and the light source may need to be far away from the wafer. The lower power reduces costs, but also reduces heating and thermal expansion. Finally, depending on the technology used, the proximity mask can be expensive. The microcavity array can be manufactured very inexpensively and is very reliably.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a photoresist mask of a desired pattern on a surface of a substrate, comprising:
   placing a photoresist on said surface of said substrate;
   placing a microcavity array, having a plurality of microcavities, in close proximity to said photoresist, wherein said microcavity array is manufactured such that said plurality of microcavities are only created in regions so as to produce said desired pattern;
   introducing gas to said microcavities; and
   activating said plurality of microcavities to emit light in said desired pattern, wherein said photoresist is set by said emission of light in said desired pattern.

2. The method of claim 1, wherein said activating comprises selectively energizing electrodes corresponding to each of said microcavities in a set.

3. The method of claim 1, further comprising filling a portion of said plurality of cavities not in said regions such that said gas cannot be introduced to said portion.

4. The method of claim 3, wherein said portion is filled with a material selected from the group consisting of photoresist and an organic material.

5. The method of claim 1, further comprising disconnecting electrodes associated with microcavities that are not in said regions.

6. The method of claim 1, further comprising introducing a glass surface between said microcavity array and said substrate, wherein said gas is introduced in a volume between said microcavity array and said glass surface.

7. The method of claim 6, further comprising focusing said light emitted from said microcavities using said glass surface.

8. The method of claim 1, wherein said gas is selected from the group comprising of argon, xenon, xenon-neon, argon-deuterium and nitrogen.

9. A method of creating a photoresist mask of a desired pattern on a surface of a substrate, comprising:
   placing a photoresist on said surface of said substrate;
   placing a microcavity array in close proximity to said photoresist, wherein said microcavity array comprises a plurality of microcavities, wherein said microcavity array is manufactured such that said plurality of microcavities are only created in regions so as to produce said desired pattern; and
   activating a gas in said plurality of microcavities to emit light in said desired pattern, wherein said photoresist is set by said emission of light in said desired pattern.

10. The method of claim 9, wherein said activating comprises selectively energizing electrodes corresponding to each of said microcavities in a set.

11. The method of claim 9, further comprising filling a portion of said plurality of cavities not in said regions.

12. The method of claim 11, wherein said portion is filled with a material selected from the group consisting of photoresist and an organic material.

13. The method of claim 9, further comprising disconnecting electrodes associated with microcavities that are not in said regions.

14. The method of claim 9, further comprising focusing said light emitted from said microcavities using a glass surface disposed on said plurality of microcavities.

15. The method of claim 9, wherein said gas is selected from the group comprising of argon, xenon, xenon-neon, argon-deuterium and nitrogen.

* * * * *